(12) United States Patent
Kotaki

(10) Patent No.: US 6,604,282 B2
(45) Date of Patent: Aug. 12, 2003

(54) CIRCUIT BOARD MANUFACTURING METHOD

(75) Inventor: Yoshitsugu Kotaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 218 days.

(21) Appl. No.: 09/725,155

(22) Filed: Nov. 29, 2000

(65) Prior Publication Data

US 2001/0047587 A1 Dec. 6, 2001

(30) Foreign Application Priority Data

Jun. 1, 2000 (JP) .................................... 2000-164946

(51) Int. Cl.[7] ................................................. H05K 3/00
(52) U.S. Cl. ............................ 29/843; 29/740; 29/743; 29/832; 29/846; 29/842; 29/830; 29/831
(58) Field of Search .................... 29/740, 743, 832, 29/846, 842, 830, 831, 843

(56) References Cited

U.S. PATENT DOCUMENTS

| | | | | |
|---|---|---|---|---|
| 4,657,778 A | * | 4/1987 | Moran | 427/53.1 |
| 4,870,746 A | * | 10/1989 | Klaser | 29/620 |
| 5,048,166 A | * | 9/1991 | Wakamatsu | 29/830 |
| 5,440,805 A | * | 8/1995 | Daigle et al. | 29/830 |
| 5,457,881 A | * | 10/1995 | Schmidt | 29/852 |
| 5,545,281 A | * | 8/1996 | Matsui et al. | 156/273.7 |
| 5,557,508 A | * | 9/1996 | Sato et al. | 361/818 |
| 5,570,506 A | * | 11/1996 | Tawata et al. | 29/851 |
| 5,603,981 A | * | 2/1997 | Hasimoto et al. | 427/96 |
| 5,848,462 A | * | 12/1998 | Sera et al. | 29/622 |
| 6,249,962 B1 | * | 6/2001 | Bergstedt | 29/830 |
| 6,315,856 B1 | * | 11/2001 | Asagiri et al. | 156/277 |

* cited by examiner

Primary Examiner—Timothy V. Eley
Assistant Examiner—David T. Nguyen
(74) Attorney, Agent, or Firm—Armstrong, Westerman & Hattori, LLP

(57) ABSTRACT

Terminals of a plurality of types of components to be mounted on a circuit board are provided beforehand with a joining material corresponding to the type of component. A basic joining material is applied to the circuit board all at one time. The basic joining material is commonly usable for joining all of the types of components to the circuit board. An individual joining material is applied to certain locations on the circuit board, to which locations components of a particular type are to be mounted. The individual joining material matches properties of the joining material provided beforehand to the components of the particular type. The second step may be performed before the first step to yield the same results.

6 Claims, 6 Drawing Sheets

FIG.4

LIST OF LEAD-FREE SOLDER MATERIAL

| TWO ELEMENTS | TIN-SILVER |
| --- | --- |
| | TIN-BISMUTH |
| | TIN-ZINC |
| | TIN-COPPER |
| | TIN-INDIUM |
| THREE ELEMENTS | TIN-SILVER-BISMUTH |
| | TIN-SILVER-COPPER |
| | TIN-SILVER-INDIUM |
| | TIN-ZINC-BISMUTH |
| | TIN-ZINC-INDIUM |
| FOUR ELEMENTS | TIN-SILVER-COPPER-BISMUTH |
| | TIN-SILVER-COPPER-INDIUM |

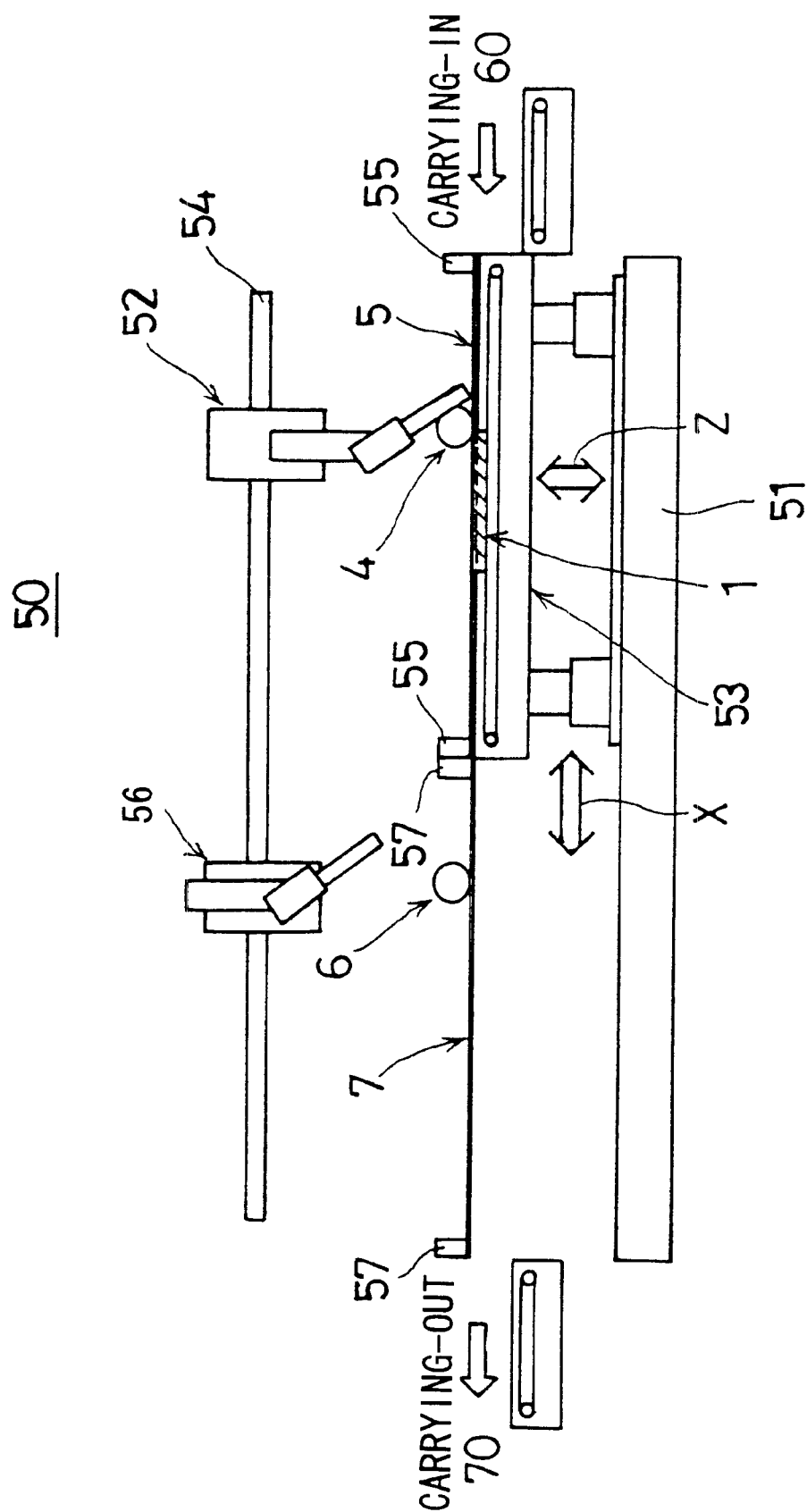

CIRCUIT BOARD MANUFACTURING METHOD

BACKGROUND OF THE INVENTION

1. Field of the Invention

The present invention generally relates to a technique for mounting components of devices such as semiconductor devices on a circuit board and, more particularly, to a method and a device for manufacturing a circuit board to allow for effective use of lead-free solder from a viewpoint of environmental protection recently in public attention. Tin-lead eutectic crystal solder has been conventionally used in general because of its overall supremacy in cost, quality, handling facility and other respects.

In recent years, however, noxiousness of lead has been pointed out, and efforts are being made to use as little lead as possible. On the other hand, some components which are joined to a circuit board still contain lead solder. Thus, until lead-containing solder is completely out of use, an effective circuit board mounting technique which can be applied to both lead solder and lead-free solder is required, while use of lead-free solder is being promoted.

2. Description of the Related Art

Conventionally, tin-lead eutectic crystal solder has been used as a material to electrically and mechanically join a circuit board and components such as semiconductor components, capacitors and resistors. On the other hand, terminals of the components themselves are either soldered or plated beforehand with tin-lead, the same elements as the joining material applied on the circuit board, to increase wettability and adhesion of the components to the circuit board. Here, a conventional mounting process to join the circuit board and the components comprises the steps of: adapting a technique of screen stencil to apply tin-lead solder to the circuit board through a screen mask all at one time; placing the components at certain locations of the circuit board; and joining the circuit board and the components by heating. Tin-lead solder as used in the above-mentioned process has been satisfactory in terms of cost, quality, durability, processing facility and other respects.

Recently, however, almost all industries have begun to avoid using lead to protect the global environment. Accordingly, in the circuit board mounting industry area where tin-lead solder has been widely used as a joining material, lead-free solder has begun to be developed.

Hence, varieties of lead-free solder are being proposed to replace conventional tin-lead solder. Generally, tin-based solder, which is technically established, is dominant, including tin-bismuth solder, tin-silver solder, tin-copper solder and tin-zinc solder. Adding a third, fourth or more element to each of these varieties of lead-free solder can create another variety of lead-free solder. Moreover, changing the elemental ratio of the above-mentioned varieties of lead-free solder can create even more varieties of lead-free solder.

In practice, manufacturers who mount components on a circuit board use their own kind of lead-free solder as a joining material depending on temperature of mounting, strength of adhesion, cost and purpose of use. Some of the manufacturers mount on a circuit board components made by a plurality of manufacturers. That means that several types of components are mounted on a circuit board. As mentioned above, to increase wettability and adhesion of components to a circuit board, terminals of the components themselves are either soldered or plated beforehand with either tin-lead solder or lead-free solder of a number of varieties. To effectively increase the wettability and adhesion of components to a circuit board, the joining material applied on the circuit board should be the same solder as that soldered or plated beforehand on the terminals of the components. However, in practice, manufacturers who mount components on a circuit board are applying one kind of lead-free solder to the circuit board as the joining material, because it is ineffective to apply different kinds of solder to the circuit board for each of the components.

However, some kinds of solder applied as a joining material on a circuit board do not match other kinds of solder or plating formed beforehand on the terminals of components, which reduces the strength of adhesion between the circuit board and the components. Facing this problem, manufacturers have to stop applying simply one kind of lead-free solder on a circuit board, but instead manually apply different kinds of solder to the circuit board for each of the mismatching components to secure a sufficient strength of adhesion.

However, a dispensing method, which is often employed as the manual applying method, requires an expert to be in operations for a relatively long time. Other problems are that supply of solder varies widely and that some configurations of terminals of components do not allow the manual applying method.

Moreover, mounted components have drastically been miniaturized, multi-pinned and made highly dense, which narrows a joining area and reduces the strength of adhesion. To make up for the reduced strength of adhesion, solder which provides a high strength of adhesion is required. On the other hand, for large-sized components, a low temperature solder is sought to be put in use, because a temperature of terminals of the large-sized components is hard to raise. These trends, together with the above-mentioned varieties of lead-free solder, increase varieties of solder used in mounting components.

SUMMARY OF THE INVENTION

It is a general object of the present invention to provide an improved and useful method for manufacturing a circuit board in which method the above-mentioned problems are eliminated.

A more specific object of the present invention is to provide a method for manufacturing a circuit board which causes no problems when a plurality of types of components provided beforehand with respectively different kinds of joining material are mounted.

Another object of the present invention is to provide a manufacturing device for embodying the method in the first object.

In order to achieve the above-mentioned objects, there is provided according to one aspect of the present invention a method of manufacturing a circuit board on which are to be mounted a plurality of types of components having terminals on which a joining material corresponding to the type of component is provided beforehand, the method comprising:

a first step of applying a basic joining material to the circuit board all at one time, the basic joining material commonly usable for joining all of the types of components to the circuit board; and a second step of applying an individual joining material to locations on the circuit board, to which locations components of a particular type are to be mounted, the individual joining material matching properties of the joining material provided beforehand to the components of the particular type.

According to the present invention, for example, a basic joining material which is commonly usable for all of the types of components to be mounted is applied to a circuit board all at one time. Further, an individual joining material matching properties of a joining material provided beforehand to the components of a particular type is applied. Thus, a circuit board applied with optimum joining materials matching respective joining materials provided beforehand to terminals of a plurality of types of components can be manufactured.

The above-mentioned first step and second step of applying joining materials are interchangeable in sequence. That is, the second step may be performed before the first step. Additionally, the second step may be performed several times to apply different kinds of individual joining materials respectively to a plurality of different types of components. It should be noted that the kind of joining material provided beforehand to the terminals of the components and the kind of joining material to be used in mounting do not necessarily have to be the same. If a basic joining material can adequately join components and a circuit board, those components do not particularly require individual joining materials to be applied.

In the above-mentioned second step of applying individual joining materials, it is preferable that the above-mentioned individual joining materials are selected so as to provide the same composition as the joining material provided beforehand to the components. Accordingly, when combined together, the basic joining material and the individual joining materials have the same composition as the joining material provided beforehand to the terminals of the components, thus increasing the wettability and adhesion.

Metallic materials commonly usable for joining all of the components can be used as the above-mentioned basic joining material, such as paste consisting solely of tin and paste consisting of a mixture of tin and silver. On the other hand, the individual joining materials may include kinds of material provided beforehand to the components. The individual joining materials, for example, may include at least one selected from a group consisting of bismuth, silver, copper, zinc and indium. Kinds of material which might possibly cause mismatching problems when combined with other kinds of solder may be included in the individual joining materials, so that conventional mismatching problems do not occur between solder of different kinds. Additionally, some material preferred to be added to solder of a certain kind may be included in the individual joining materials.

In the above-mentioned first step and second step of applying joining materials, joining materials may be applied to the above-mentioned circuit board either in the form of paste or by means of a plating method.

Additionally, in order to achieve the above-mentioned objects, there is provided according to another aspect of the present invention a method of mounting on a circuit board a plurality of types of components having terminals on which a joining material corresponding to the type of component is provided beforehand, the method comprising:

a first step of applying a basic joining material to the circuit board all at one time, the basic joining material commonly usable for joining all of the types of components to the circuit board;

a second step of applying an individual joining material to locations on the circuit board, to which locations components of a particular type are to be mounted, the individual joining material matching properties of the joining material provided beforehand to the components of the particular type; and a third step of heating to join the circuit board and the plurality of types of components after completion of the first step and the second step.

Additionally, in order to achieve the above-mentioned objects, there is provided according to another aspect of the present invention a device for manufacturing a circuit board on which are to be mounted a plurality of types of components having terminals on which a joining material corresponding to the type of component is provided beforehand, the device comprising:

first means for applying a basic joining material to the circuit board all at one time, the basic joining material commonly usable for joining all of the types of components to the circuit board; and second means for respectively applying an individual joining material to locations on the circuit board, to which locations components of a particular type are to be mounted, the individual joining material matching properties of the joining material provided beforehand to the components of the particular type.

The above-mentioned first and second means for applying joining materials are also achieved by application of a printing method and a dispensing method.

The above-mentioned device for manufacturing a circuit board is achieved by a printing method, wherein the first means has a blanket solder mask provided with openings to apply the basic joining material to all locations on the circuit board at one time, at which locations the components are to be mounted, the basic joining material in the form of paste; and the second means has a sectional solder mask provided with openings to apply the individual joining material to predetermined locations on the circuit board, at which predetermined locations the components of the particular type are to be mounted, the individual joining material in the form of paste, wherein, by the first means and the second means, lamination of the basic joining material and the individual joining material is formed at the predetermined locations on the circuit board.

Additionally, the above-mentioned device for manufacturing a circuit board can be more productive, wherein, when the blanket solder mask is arranged facing the circuit board, the sectional solder mask is arranged over the blanket solder mask so that the lamination of joining materials is formed by consecutively applying the basic joining material and the individual joining materials.

Other objects, features and advantages of the present invention will become more apparent from the following detailed description when read in conjunction with the accompanying drawings.

BRIEF DESCRIPTION OF THE DRAWINGS

FIG. 4 is an illustration of examples of lead-free solder material usable in the present invention;

FIG. 5 is an illustration of a manufacturing device of a circuit board according to a first embodiment of the present invention;

DETAILED DESCRIPTION OF THE PREFERRED EMBODIMENTS

Figure 1:
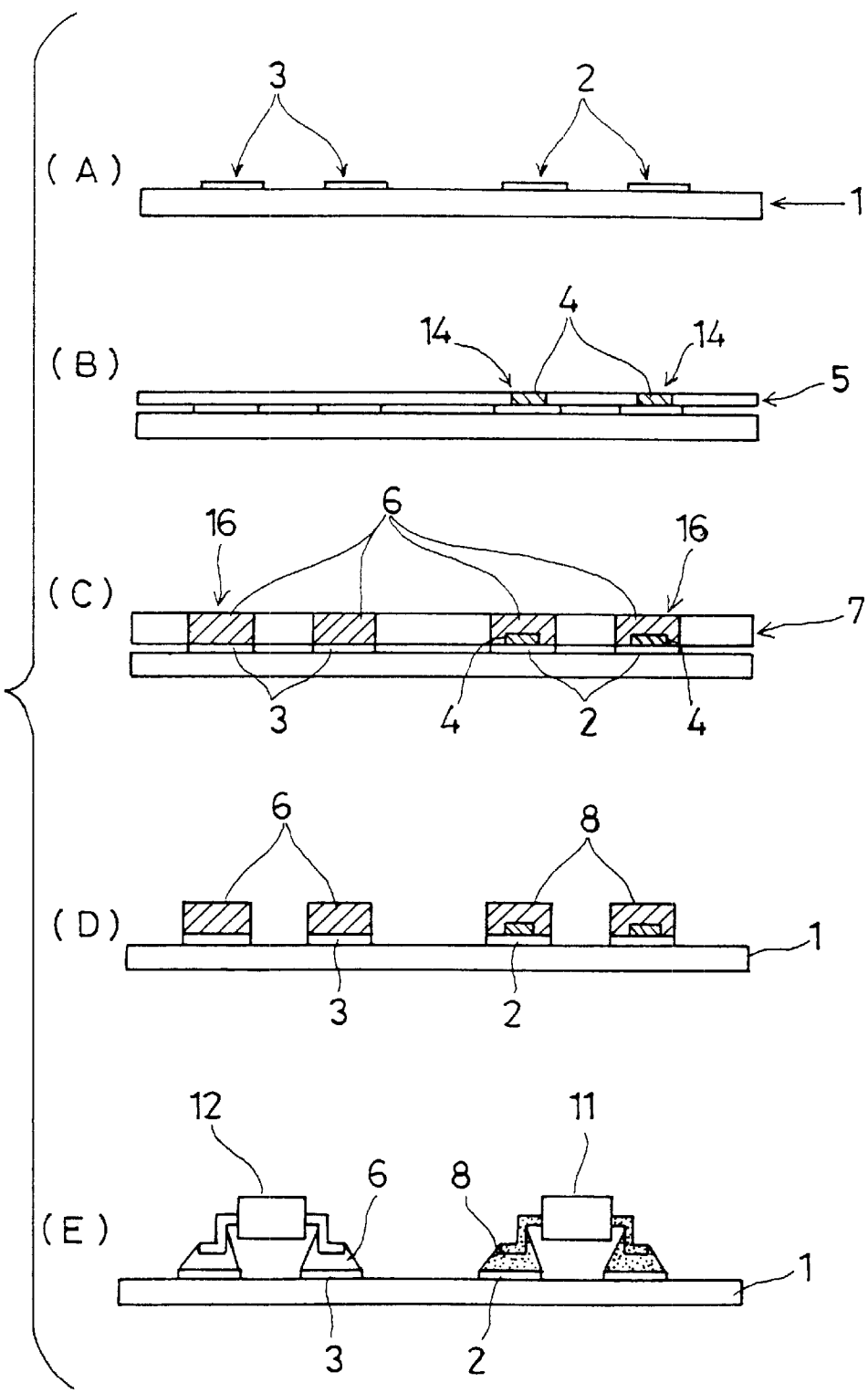
FIGS. 1A–1E are a sequential chart for explaining a principle of the present invention.

A description will now be given, with reference to the drawings, of the present invention. FIG. 1 is a sequential chart for explaining a principle of the present invention. In the present invention, processes of applying joining materials to a circuit board are improved so that the joining materials match individual joining materials provided beforehand to a plurality of types of components 11 and 12.

FIG. 1, provided for a better understanding of the present invention, is a sequential chart of mounting the component 12 whose terminals are plated with tin-lead and the component 11 whose terminals are plated with tin-bismuth, a lead-free material, both onto a circuit board 1. It should be noted that inventors of the present invention have confirmed that solder comprising bismuth and lead causes a considerable low temperature phenomenon and, after the mounting, poor connection to the circuit board.

FIG. 1-(A) shows the circuit board 1 on which a conductor pattern 2 and a conductor pattern 3 are formed. The component 11 with tin-bismuth plating is to be mounted on the conductor pattern 2 and the component 12 with tin-lead plating is to be mounted on the conductor pattern 3.

FIG. 1-(B) shows a solder mask 5 for applying bismuth paste 4 only onto the conductor pattern 2. The solder mask 5 is designed to apply a joining material to certain locations on the circuit board 1. Because the component 11 with tin-bismuth plating is to be mounted on the conductor pattern 2, solder comprising bismuth increases adhesion of the component 11 to the circuit board 1.

On the other hand, if bismuth was applied to the conductor pattern 3 on which the component 12 with tin-lead plating is to be mounted, solder comprising lead and bismuth would result from fusion by heating. This would cause the above-mentioned poor connection by the low fusion point phenomenon. To prevent this, the bismuth paste 4 should be only applied to the conductor pattern 2.

FIG. 1-(B) shows the second step of respectively applying an individual joining material (bismuth in this case) to locations on the circuit board 1, at which locations components of the same type are to be mounted, the individual joining material matching properties of the joining material (including bismuth) provided beforehand to the component 11. The solder mask 5 used in this step is a sectional solder mask provided with openings 14 to apply the bismuth paste 4 only to the conductor pattern 2.

FIG. 1-(C) shows the first step of applying tin-silver paste to the circuit board 1 all at one time using a solder mask 7, the tin-silver paste being a basic joining material which is commonly usable for joining the components 11 and 12. The solder mask 7 is a blanket solder mask provided with openings 16 to apply a joining material to the conductor patterns 2 and 3 all at one time. The solder mask 7 should be arranged not to contact the bismuth paste 4 already applied.

The thicknesses of the sectional solder mask 5 and the blanket solder mask 7 and the diameters of the openings 14 and 16 of the sectional solder mask 5 and the blanket solder mask 7, respectively, may be determined by reference to the amount of solder needed to join the components and the composition of solder provided beforehand to the components. Notably, it is advisable that the diameter of the opening 16 of the blanket solder mask 7 be smaller than the conductor patterns 2 and 3.

It should be noted that FIG. 1-(B) only shows one step of respectively applying a joining material, using bismuth as an example. The step of FIG. 1-(B) may be repeated with different solder masks 5, in case different kinds of components respectively need different kinds of joining material.

Next, FIG. 1-(D) is an illustration of removing the above-mentioned blanket solder mask 7 from the circuit board 1. On the conductor pattern 3 is applied tin-silver paste 6. On the conductor pattern 2 are applied the bismuth paste 4 and the tin-silver paste 6, forming lamination 8 of tin-silver-bismuth paste.

The steps in the above-mentioned FIG. 1-(A) through FIG. 1-(D) can manufacture the circuit board 1 on which a plurality of the components 11 and 12 are to be mounted.

Further, as shown in FIG. 1-(E), the component 12 with tin-lead plating is mounted on the conductor pattern 3, and the component 11 with tin-bismuth plating is mounted on the conductor pattern 2. Then, by heating, the lamination 8 of tin-silver-bismuth paste on the conductor pattern 2 is melted at a certain temperature into solder with the same quality as the solder of the component 11 and then cooled down. This joins the component 11 firmly to the conductor pattern 2.

As for the component 12, the tin-silver paste 6 is melted at a certain temperature and then cooled down, which joins the component 12 to the conductor pattern 3.

It should be noted that, in FIG. 1, the tin-silver paste 6 is used to match the component 12 plated with tin-lead solder, from a viewpoint of lead-free mounting. The above-mentioned step of FIG. 1-(B) may be performed, as a second step of respectively applying lead as a joining material, to match the composition of the solder of the component 12.

Additionally, the steps of FIG. 1 illustrate an example where the tin-silver paste 6 is applied as a basic joining material after the bismuth paste 4 is applied to the circuit board 1 as an individual joining material. However, there is no restriction in the sequence of the steps of applying a basic joining material and an individual joining material. In case of applying two or more individual joining materials, the sequence may be as follows: a first step of applying an individual joining material; then a step of applying a basic joining material; and next a second step of applying another individual joining material.

FIG. 1 illustrates an application of a printing technique in applying the bismuth paste 4 and the tin-silver paste 6 through the mask 5 and 7 respectively. A dispensing device also may perform the second step of applying a basic joining material and the first step of applying an individual joining material.

Figure 2A:
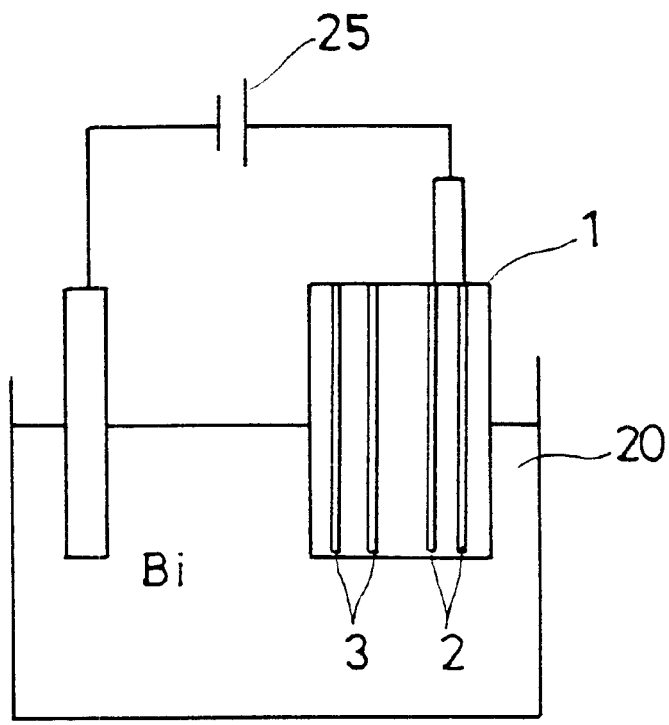
FIG. 2A is an illustration of a principle of applying an individual joining material to a circuit board by means of a plating method.
Figure 2B:
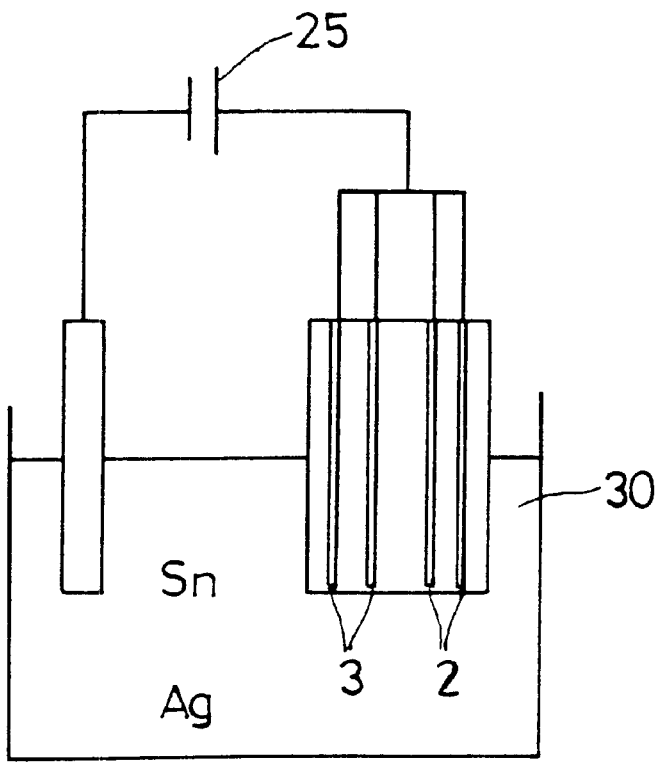
FIG. 2B is an illustration of a principle of applying a basic joining material to a circuit board by means of a plating method.

While FIG. 1 illustrates a method of applying joining materials in the form of paste, a plating method may also be used in applying joining materials. FIG. 2A and FIG. 2B correspond to FIG. 1. FIG. 2A is an illustration of a principle of applying an individual joining material (bismuth in this case) to the circuit board 1 by means of a plating method. FIG. 2B is an illustration of a principle of applying a basic joining material (tin-silver in this case) to the circuit board 1 by means of a plating method. The same reference characters are used to designate the same parts as in FIG. 1.

FIG. 2A is an illustration of a plating bath for plating only the conductor pattern 2 with bismuth (Bi). A plating solution 20 comprises bismuth ions dissolved in an organic acid. The circuit board 1 is immersed into the plating solution 20. A power source 25 supplies positive charge (+) only to the conductor pattern 2. This allows only the conductor pattern 2 to be plated with bismuth.

FIG. 2B is an illustration of a plating bath for plating both the conductor pattern 2 and the conductor pattern 3 with tin and silver (Sn—Ag). A plating solution 30 comprises tin ions and silver ions both dissolved in an organic acid. The circuit board 1 is immersed into the plating solution 30. A power source 25 supplies positive charge (+) to both the conductor pattern 2 and the conductor pattern 3. This allows both the conductor pattern 2 and the conductor pattern 3 to be plated with tin and silver.

Figure 3A:
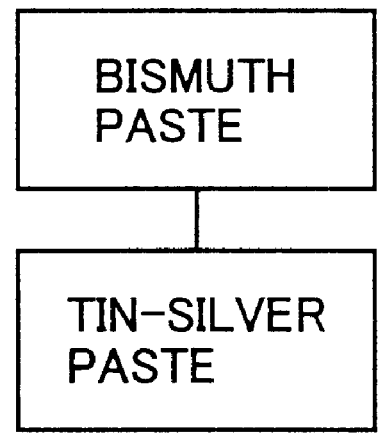
FIG. 3A, FIG. 3B and FIG. 3C are illustrations of possible combinations of means to apply different kinds of joining material to a circuit board.
Figure 3B:
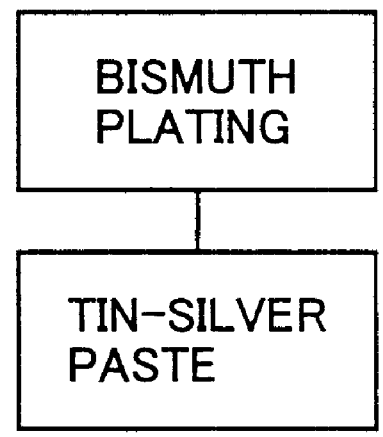
Figure 3C:
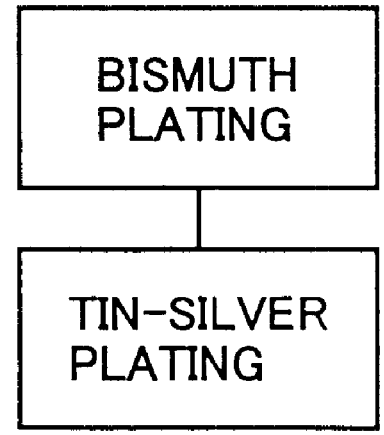

As shown in FIG. 1, FIG. 2A and FIG. 2B, joining materials may be applied to the circuit board 1 either in the form of paste or by means of the plating method. For example, the tin-silver paste 6 may be applied all at one time to the circuit board 1 after bismuth plating is formed as an individual joining material on the conductor pattern 2 by the plating method. Also, bismuth paste 4 may be applied to the circuit board 1 partially, after tin-silver plating is formed as a basic joining material on both the conductor pattern 2 and the conductor pattern 3 by the plating method. FIG. 3A, FIG. 3B and FIG. 3C show possible combinations of means to apply joining materials to the circuit board 1.

FIG. 4 shows examples of lead-free solder material usable in the present invention including examples of two elements, three elements and four elements based on tin conventionally widely used. The tin-silver-bismuth material in FIG. 1, FIG. 2A and FIG. 2B may be composed of 1 to 10 wt percent bismuth, 2 to 5 wt percent silver and the rest of tin.

A description will now be given, with reference to FIG. 5, of a circuit board manufacturing device 50 according to a first embodiment of the present invention. The circuit board manufacturing device 50 applies joining materials in the form of paste to a circuit board by application of a printing method.

In the present embodiment, the description will be given, as in FIG. 1, of specifically applying the bismuth paste 4 and the tin-silver paste 6 to the circuit board 1. The same reference characters are used for designating the same parts as in FIG. 1.

In FIG. 5, the circuit board 1 is carried in through a circuit board carrying-in part 60 on the right side for the subsequent processes. The circuit board 1 is then fixed to a certain position on a stage 53. The stage 53 is placed on a base 51 and is capable of moving in a vertical direction shown by an arrow Z and in a horizontal direction shown by an arrow X.

On the stage 53, the sectional solder mask 5 is formed in a mask frame 55 arranged near the circuit board carrying-in part 60. The blanket solder mask 7 is formed in a mask frame 57 arranged near a circuit board carrying-out part 70.

Above the sectional solder mask 5 is arranged a first squeegee 52. The first squeegee 52 moves in a horizontal direction along a leading rail 54 and paints the bismuth paste 4 into the surface of the sectional solder mask 5 to sectionally apply the bismuth paste 4 to the circuit board 1. In the same manner, above the blanket solder mask 7 is arranged a second squeegee 56. The second squeegee 56 moves in a horizontal direction along the leading rail 54 and paints the tin-silver paste 6 into the surface of the blanket solder mask 7 to apply the tin-silver paste 6 as a basic joining material to the circuit board 1.

In the above-mentioned circuit board manufacturing device 50, the circuit board 1 is carried in through the circuit board carrying-in part 60 and then fixed on the stage 53. After certain adjustments in position, the stage 53 ascends to the mask 5 and halts where the circuit board 1 adjoins the mask 5. Then, the first squeegee 52 sectionally applies the bismuth paste 4 to the circuit board 1, as shown in FIG. 1-(B).

Subsequently, the stage 53 descends and then moves to just under the blanket solder mask 7. After certain adjustments in position, the stage 53 ascends to the mask 7 and halts where the circuit board 1 adjoins the mask 7. Then, the second squeegee 56 applies the tin-silver paste 6 as a basic joining material to the circuit board 1, as shown in FIG. 1-(C). Thereafter, the stage 53 descends and the circuit board 1 is carried out through the circuit board carrying-out part 70. Finally, components are to be mounted at certain locations on the circuit board 1, followed by a heating process.

As mentioned before, there is no restriction in the sequence of the steps of applying the bismuth paste 4 and the tin-silver paste 6. Thus, the device according to the present embodiment may be used with the positions of the sectional solder mask 5 and the blanket solder mask 7 exchanged.

Although the present first embodiment comprises the stage 53 capable of moving in the horizontal direction X, two stages 53 may be arranged respectively for the sectional solder mask 5 and the blanket solder mask 7. This arrangement shortens the duration of applying paste materials, and thus increases the productivity.

A description will now be given, with reference to FIG. 6A and FIG. 6B, of a circuit board manufacturing device 100 according to a second embodiment of the present invention. The circuit board manufacturing device 100 is a variation of the manufacturing device 50 shown in FIG. 5 and is capable of consecutively applying joining materials in the form of paste using multistage solder masks.

In the present embodiment, the description will be given, as in FIG. 1, of specifically applying the bismuth paste 4 and the tin-silver paste 6 to the circuit board 1. The same reference characters are used for designating the same parts as in FIG. 5.

Figure 6A:
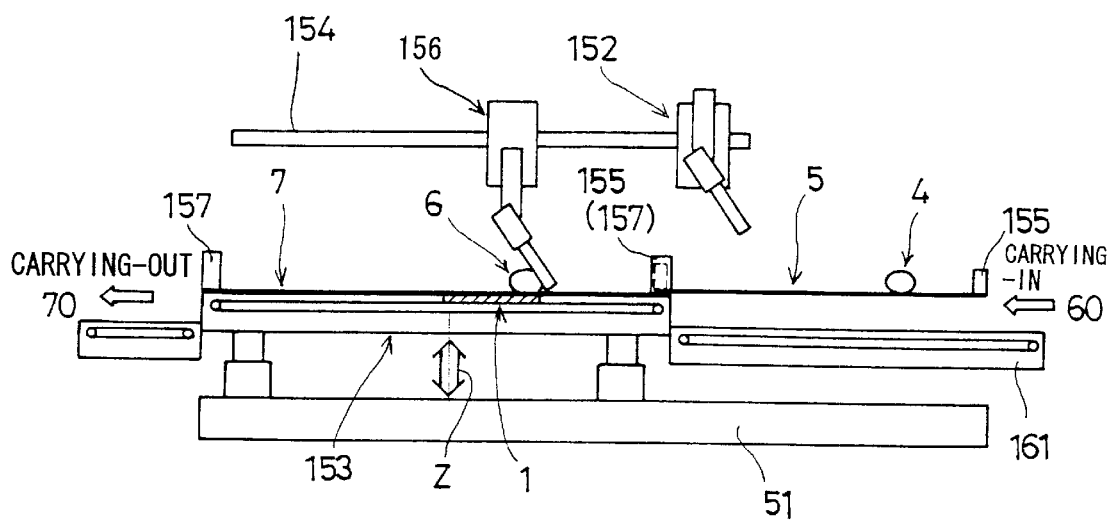
FIG. 6A is an illustration of a manufacturing device of a circuit board before a mask frame 155 shifts over to a mask frame 157 according to a second embodiment of the present invention.

In FIG. 6A, the circuit board 1 is carried in through the circuit board carrying-in part 60 on the right side for the subsequent processes. The circuit board 1 is then conveyed to a stage 153 by a circuit board conveyor 161 and fixed to a certain position on the stage 153. The stage 153 is placed on the base 51 and is capable of moving in a vertical direction shown by an arrow Z.

Above the base 51, the sectional solder mask 5 is formed in a mask frame 155 arranged near the circuit board carrying-in part 60. The blanket solder mask 7 is formed in a mask frame 157 arranged near the circuit board carrying-out part 70. In the present embodiment, the mask frame 155 is capable of shifting over to the mask frame 157, as shown in FIG. 6B.

Above the blanket solder mask 7 is arranged a leading rail 154. Along the leading rail 154 is arranged a first squeegee 152. The first squeegee 152 moves in a horizontal direction along the leading rail 154 and paints the bismuth paste 4 into the surface of the sectional solder mask 5 to sectionally apply the bismuth paste 4 to the circuit board 1. In the same manner, along the leading rail 154 is arranged a second squeegee 156. The second squeegee 156 moves in a horizontal direction along the leading rail 154 and paints the tin-silver paste 6 into the surface of the blanket solder mask 7 to apply the tin-silver paste 6 as a basic joining material to the circuit board 1.

The present embodiment shows an example where the second squeegee 156 applies the tin-silver paste 6 as a basic joining material to the circuit board 1 and the first squeegee 152 sectionally applies the bismuth paste 4 to the circuit board 1.

In the above-mentioned circuit board manufacturing device 100, the circuit board 1 is carried in through the circuit board carrying-in part 60 and then fixed on the stage 153. After certain adjustments in position, the stage 153 ascends to the mask 7 and halts where the circuit board 1 adjoins the mask 7. Subsequently, the second squeegee 156 applies the tin-silver paste 6 as a basic joining material to the circuit board 1.

Figure 6B:
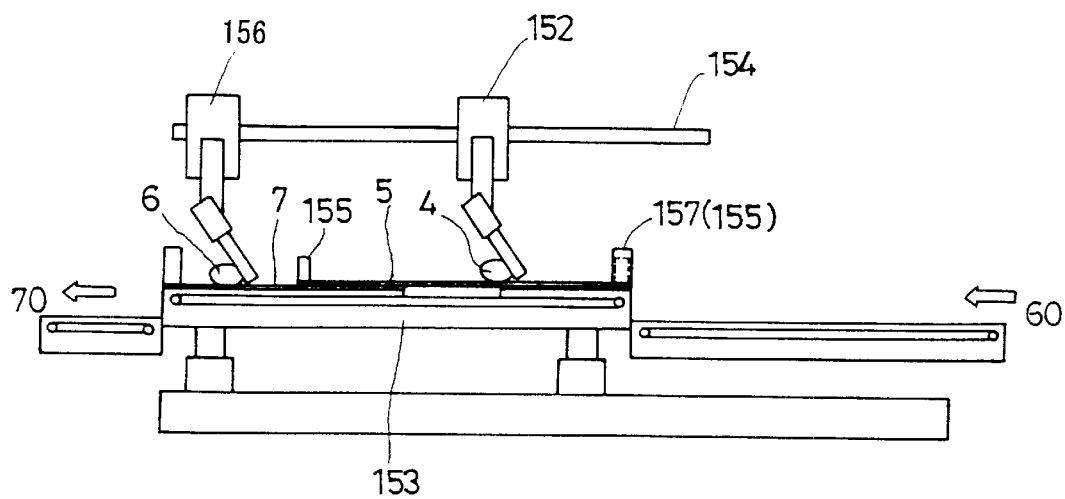
FIG. 6B is an illustration of the manufacturing device of a circuit board shown in FIG. 6A after the mask frame 155 shifts over to the mask frame 157 according to the second embodiment of the present invention.

Following the movement of the above-mentioned second squeegee 156, the mask frame 155 shifts over to the mask frame 157, as shown in FIG. 6B. Then, the first squeegee 152 sectionally applies the bismuth paste 4 to the circuit board 1. Thereafter, the stage 153 descends and the circuit board 1 is carried out through the circuit board carrying-out part 70. Finally, components are to be mounted at certain locations on the circuit board 1, followed by a heating process.

In the present second embodiment, as mentioned before, there is no restriction in the sequence of the steps of applying the bismuth paste 4 and the tin-silver paste 6. Thus, the device according to the present embodiment may be used with the positions of the sectional solder mask 5 and the blanket solder mask 7 exchanged.

The present second embodiment applies the bismuth paste 4 and the tin-silver paste 6 consecutively to the circuit board 1, which shortens the duration of applying paste materials and thus increases the productivity.

The present invention is not limited to the specifically disclosed embodiments, and variations and modifications may be made without departing from the scope of the present invention.

The present application is based on Japanese priority application No. 2000-164946 filed on Jun. 1, 2000, the entire contents of which are hereby incorporated by reference.

What is claimed is:

1. A method of manufacturing a circuit board to be mounted with a plurality of types of components each having a plurality of terminals which are precoded with a joining material corresponding to one of said types of components, comprising:

a first step of applying a basic joining material to said circuit board all at one time; and a second step of applying an individual joining material whose properties match that of said joining material to a plurality of locations of said circuit board where components of a particular type are to be mounted thereon.

2. The method as claimed in claim 1, wherein, in said second step, said individual joining material is selected so as to provide a same composition as said joining material.

3. The method as claimed in claim 2, wherein said basic joining material contains at least tin.

4. The method as claimed in claim 2, wherein said individual joining material is at least one selected from a group consisting of bismuth, silver, copper, zinc and indium.

5. The method as claimed in claim 4, wherein, at least one of said first step and said second step includes applying said basic joining material and/or said individual joining material in the form of paste to said circuit board.

6. The method as claimed in claim 4, wherein, at least one of said first step and said second step includes applying said basic joining material and/or said individual joining material by means of a plating method to said circuit board.

* * * * *